(12) United States Patent
Seko

(10) Patent No.: US 7,053,494 B2
(45) Date of Patent: May 30, 2006

(54) SEMICONDUCTOR DEVICE AND PRODUCTION METHOD THEREFOR

(75) Inventor: Toshiharu Seko, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/839,334

(22) Filed: May 6, 2004

(65) Prior Publication Data

US 2004/0227256 A1    Nov. 18, 2004

(30) Foreign Application Priority Data

May 16, 2003    (JP)    ............................. 2003-139023

(51) Int. Cl.
  *H01L 21/48*    (2006.01)
  *H01L 29/40*    (2006.01)
(52) U.S. Cl. ...................... 257/784; 257/778; 257/729; 257/780; 257/781; 257/782; 257/783; 438/107; 438/108; 438/614; 438/617; 438/618
(58) Field of Classification Search ................ 257/780, 257/781, 782, 783, 784, 760, 778, 777, 779; 438/612, 616, 108, 109, 613, 107, 617, 618, 438/614
See application file for complete search history.

(56) References Cited

U.S. PATENT DOCUMENTS 6,204,564 B1 *    3/2001    Miyata et al. .............. 257/778

FOREIGN PATENT DOCUMENTS

| JP | 1689504 | 2/1990 |
| JP | 2039510 | 8/1995 |
| JP | 2064463 | 10/1995 |
| JP | 2001-176918 | 6/2001 |

* cited by examiner

*Primary Examiner*—Nathan J. Flynn
*Assistant Examiner*—Fazli Erdem
(74) *Attorney, Agent, or Firm*—Nixon & Vanderhye P.C.

(57) ABSTRACT

A semiconductor device includes a film substrate having an interconnection pattern provided on a surface thereof, a semiconductor chip mounted on the film substrate and having an electrode provided on a surface thereof, and an insulative resin portion provided between the film substrate and the semiconductor chip, the resin portion having been formed by applying an insulative resin on at least one of the film substrate and the semiconductor chip and filling a space defined between the film substrate and the semiconductor chip with the resin when the semiconductor chip is mounted on the film substrate, wherein the interconnection pattern has a projection which has a sectional shape tapered toward the electrode of the semiconductor chip and intrudes in the electrode thereby to be electrically connected to the electrode.

12 Claims, 12 Drawing Sheets

(a)

(b)

(a)

(b)

SEMICONDUCTOR DEVICE AND PRODUCTION METHOD THEREFOR

CROSS-REFERENCE TO RELATED APPLICATIONS

This application is related to Japanese patent application No. 2003-139023 filed on May 16, 2003, whose priority is claimed under 35 USC § 119, the disclosure of which is incorporated by reference in its entirety.

BACKGROUND OF THE INVENTION

1. Field of the Invention

The present invention relates to a semiconductor device and a production method therefor. More specifically, the invention relates to a semiconductor device including a semiconductor chip bonded to and mounted on a flexible wiring board thereof, and a production method therefor.

2. Description of the Related Art

The following is known as the prior art of the present invention.

(1) A semiconductor device production method which comprises the steps of: stacking a semiconductor chip having Au bump electrodes at a predetermined position on a flexible wiring board; pressing the semiconductor chip against the flexible wiring board at a pressure of 0.1 to 0.3 N per bump electrode while heating the semiconductor chip at a relatively high temperature on the order of 400° C. to 450° C. to heat-bond the bump electrodes of the semiconductor chip to an interconnection pattern of the flexible wiring board; injecting a thermosetting resin into a space defined between the flexible wiring board and the semiconductor chip; and thermosetting the injected resin (see, for example, Japanese Unexamined Patent Publication No. 2001-176918).

(2) A semiconductor device production method which comprises the steps of: applying a photo-curable or thermosetting resin on a surface of a flexible board to cover an interconnection pattern provided on the flexible board; mounting a semiconductor chip on the applied resin with the interconnection pattern being opposed to bump electrodes of the semiconductor chip; pressing the semiconductor chip against the flexible board to push away portions of the resin present between the interconnection pattern and the bump electrodes to bring the bump electrodes into contact with the interconnection pattern; and curing the resin by irradiation with light or by heating at a relatively low temperature on the order of 150° C. or lower (see, for example, Japanese Patent No. 1689504).

(3) A semiconductor device production method which comprises the steps of: applying a thermosetting resin on a surface of a flexible board to cover an interconnection pattern provided on the flexible board; mounting a semiconductor chip on the applied resin with the interconnection pattern being opposed to bump electrodes of the semiconductor chip; pressing the semiconductor chip against the flexible board to push away portions of the resin present between the interconnection pattern and the bump electrodes to bring the bump electrodes into contact with the interconnection pattern with the use of a pulse heating tool which is adapted to generate heat when being energized; and energizing the pulse heating tool to heat the semiconductor chip at a relatively low temperature on the order of 100° C. to 250° C. with the semiconductor chip kept pressed against the flexible board to cure the resin (see, for example, Japanese Patent No. 2039510).

(4) A semiconductor device production method which comprises the steps of: applying a UV-curable/thermosetting resin on a surface of a flexible board to cover an interconnection pattern provided on the flexible board; mounting a semiconductor chip on the applied resin with the interconnection pattern being opposed to bump electrodes of the semiconductor chip; pressing the semiconductor chip against the flexible board to push away portions of the resin present between the interconnection pattern and the bump electrodes to bring the bump electrodes into contact with the interconnection pattern; curing a portion of the resin on the periphery of the semiconductor device by irradiating the resin with ultraviolet radiation with the semiconductor chip kept pressed against the flexible board; and completely curing the resin by heating (see, for example, Japanese Patent No. 2064463).

So-called TCP (tape carrier package) and COF (chip on film) semiconductor devices are known as semiconductor devices which include a flexible wiring board and a semiconductor chip mounted on the flexible wiring board.

In the TCP device, the flexible wiring board has an opening and includes an interconnection pattern having a distal end portion projecting over the opening, and the semiconductor chip is mounted on the flexible wiring board as being supported on the distal end portion of the interconnection pattern projecting over the opening.

In the COF device, on the contrary, the flexible wiring board does not have an opening as provided in the TCP device, and the semiconductor chip is mounted directly on the flexible wiring board.

In recent years, there has been a trend for a semiconductor chip to have an increased number of pins (bump electrodes) arranged at a reduced pitch. The COF device should also follow this trend.

In production of the COF device, the interconnection pattern is liable to deform when the semiconductor chip is mounted on the flexible wiring board by pressing the semiconductor chip against the flexible wiring board. This may result in so-called "edge touch" which means that the peripheral edges of the mounted semiconductor chip touch the interconnection pattern. To cope with this problem, an MBB (micro bump bonding) method, an NCP (non-conductive paste) method and an ACP (anisotropic conductive paste) method are employed for bonding and sealing of the COF device in the COF production process.

In the MBB, NCP and ACP methods, the bump electrodes are not heat-bonded to the interconnection pattern at a relatively high temperature on the order of 400° C. to 450° C. as employed in the prior art production method (1), but the bump electrodes are fixed and connected to the interconnection pattern by curing a resin at a relatively low temperature on the order of 100° C. to 250° C. Therefore, the MBB, NCP and ACP methods are classified into a lower temperature bonding technique for the COF production process.

The COF device should satisfy requirements for size reduction, thickness reduction and weight reduction as well as for the increase in the pin number and the resolution of the edge touch problem. In order to simultaneously satisfy these requirements, the pitch of connection portions of the interconnection pattern to be connected to the semiconductor chip should be reduced, and the thickness of an insulation tape as a base of the flexible wiring board and the thickness of the interconnection pattern should be reduced.

With the requirements for the reduction of the pitch of the connection portions and the thickness reduction of the insulation tape and the interconnection pattern, the prior art production method (1) in which the bump electrodes are heat-bonded to the interconnection pattern at a relatively high temperature on the order of 400° C. to 450° C. suffers from the following problems. The expansion and contraction of the insulation tape significantly influence the positioning of the bump electrodes with respect to the interconnection pattern for the mounting, resulting in a cumulative dimensional difference between the interconnection pattern and the bump electrodes. This makes it difficult to provide sufficient contact areas between the interconnection pattern and the bump electrodes, resulting in insufficient electrical connection. In addition, the interconnection pattern having a reduced thickness is more liable to deform when the semiconductor chip is pressed against the flexible wiring board. Therefore, the edge touch is more liable to occur.

In the prior art production methods (2) to (4) (which are classified into the lower temperature bonding technique), the cumulative dimensional difference attributable to the expansion of the interconnection pattern is less liable to occur because the semiconductor chip is heated at a relatively low temperature. Since the semiconductor chip is mounted on the resin preliminarily applied on the flexible wiring board and pressed against the flexible wiring board, the resin intervenes between the interconnection pattern and the peripheral edges of the semiconductor chip. Therefore, even if the interconnection pattern deforms, the edge touch is less liable to occur.

In the prior art production methods (2) to (4), however, the resin is present between the flexible wiring board and the semiconductor chip. Therefore, the semiconductor chip is liable to slide on the resin partly present between the electrodes of the semiconductor chip and the interconnection pattern when the semiconductor chip is pressed against the flexible board. Hence, there is a possibility that a positional offset occurs between the interconnection pattern and the bump electrodes. In addition, the resin partly present between the interconnection pattern and the bump electrodes may cause an electrical connection failure.

Since the lower temperature bonding technique is employed for connecting the bump electrodes to the interconnection pattern, the connection is established simply by the contacts between the interconnection pattern and the bump electrodes provided by the pressing and the curing of the resin present between the flexible wiring board and the semiconductor chip. Hence, the bump electrodes are connected to the interconnection pattern with a lower mechanical strength. Where the COF device is repeatedly subjected to a low temperature and a high temperature or a high humidity during use, the semiconductor chip may be separated from the flexible board, resulting in an electrical connection failure between the interconnection pattern and the bump electrodes.

More specifically, where the COF device repeatedly expands and contracts due to a temperature cycle and swells due to moisture absorption during use, the flexible wiring board of the COF device and/or the semiconductor chip are liable to be separated from the resin due to differences in heat expansion coefficient between the flexible wiring board and the resin and between the semiconductor chip and the resin.

Further, where the pressing is stopped during the heating (constant heating method), the productivity is improved, but an electrical connection failure is liable to occur.

SUMMARY OF THE INVENTION

In view of the foregoing, the present invention is directed to a semiconductor device and a production method therefor which ensure improvement in the reliability of the connection between an interconnection pattern and bump electrodes and in yield and productivity.

According to the present invention, there is provided a semiconductor device, which comprises: a film substrate having an interconnection pattern provided on a surface thereof; a semiconductor chip mounted on the film substrate and having an electrode provided on a surface thereof; and an insulative resin portion provided between the film substrate and the semiconductor chip, the resin portion having been formed by applying an insulative resin on at least one of the film substrate and the semiconductor chip and filling a space defined between the film substrate and the semiconductor chip with the resin when the semiconductor chip is mounted on the film substrate; wherein the interconnection pattern has a projection which has a sectional shape tapered toward the electrode of the semiconductor chip and intrudes in the electrode thereby to be electrically connected to the electrode.

In the inventive semiconductor device, the interconnection pattern has the projection which has a sectional shape tapered toward the electrode of the semiconductor chip. Therefore, when the semiconductor chip is pressed against the film substrate in a semiconductor device production process, a portion of the resin present between the projection of the interconnection pattern and the electrode is pushed away by a tapered distal portion of the projection, and the projection intrudes in the electrode. Thus, the electrical connection between the projection and the electrode can effectively be established.

This means that the projection and the electrode are effectively electrically and physically connected to each other with an enhanced mechanical strength, even if the connection is established simply by a contact between the projection and the electrode provided by the pressing and the curing of the resin. Since the portion of the resin present between the projection and the electrode is pushed away by the tapered distal portion of the projection, a positional offset between the projection and the electrode is suppressed which may otherwise occur when the semiconductor chip is pressed against the film substrate. Thus, the reliability of the connection between the projection and the electrode is improved.

Even if a cumulative dimensional difference between projections and electrodes occurs due to expansion of the film substrate attributable to the heating of the semiconductor chip in the semiconductor device production process, the reliability of the connection between the projection and the electrode is not deteriorated. This is because the projection intrudes in the electrode thereby to be connected to the electrode with a sufficient contact area.

Even if the interconnection pattern deforms due to the pressing of the semiconductor chip, the edge touch is prevented because the insulative resin portion intervenes between the film substrate and the semiconductor chip.

BRIEF DESCRIPTION OF THE DRAWINGS

FIGS. 3(a) to 7(a) and FIGS. 3(b) to 7(b) are diagrams for explaining the steps of a COF semiconductor device production process according to the first embodiment of the invention, and respectively illustrate schematic constructions (corresponding to FIG. 1) and sections (corresponding to FIG. 2) provided in the respective steps;

FIGS. 11 (a) to 13(a) and FIGS. 11(b) to 13(b) are diagrams for explaining the steps of a COF semiconductor device production process according to the third embodiment of the invention, and respectively illustrate schematic constructions (corresponding to FIG. 1) and sections (corresponding to FIG. 2) provided in the respective steps;

DESCRIPTION OF THE PREFERRED EMBODIMENTS

Figure 1:
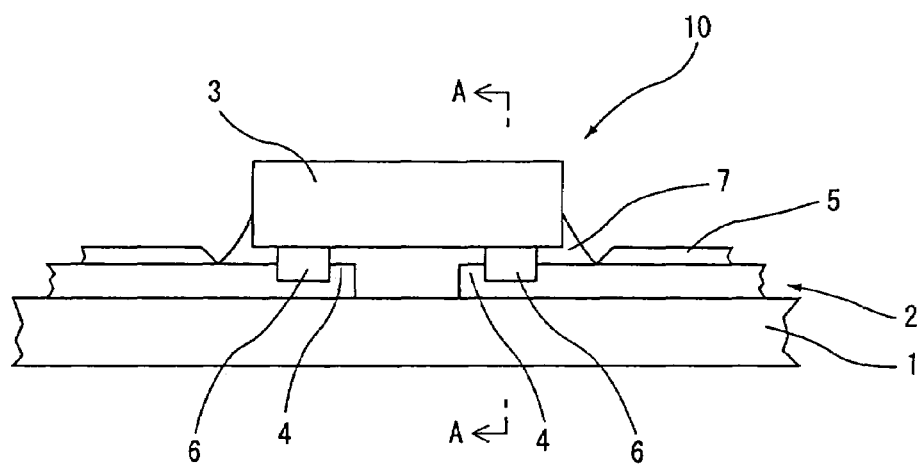
FIG. 1 is a diagram schematically illustrating the construction of a COF semiconductor device according to a first embodiment of the present invention.

A semiconductor device according to the present invention comprises: a film substrate having an interconnection pattern provided on a surface thereof; a semiconductor chip mounted on the film substrate and having an electrode provided on a surface thereof; and an insulative resin portion provided between the film substrate and the semiconductor chip, the resin portion having been formed by applying an insulative resin on at least one of the film substrate and the semiconductor chip and filling a space defined between the film substrate and the semiconductor chip with the resin when the semiconductor chip is mounted on the film substrate; wherein the interconnection pattern has a projection which has a sectional shape tapered toward the electrode of the semiconductor chip and intrudes in the electrode thereby to be electrically connected to the electrode.

The interconnection pattern is a thin film of a conductive material such as Cu, Al, Au or ITO having a predetermined pattern. For example, the interconnection pattern is formed by patterning a copper foil having a thickness of about 5 μm to about 18 μm and plating the copper foil pattern with tin or gold. The patterning of the thin film may be achieved, for example, by etching.

The film substrate is a flexibly bendable thin film of an insulative material. For example, a polyimide insulative tape having a thickness of about 15 μm to about 40 μm may be employed for the film substrate.

The semiconductor chip includes a semiconductor substrate, an integrated circuit formed in the semiconductor substrate, and the electrode provided on the surface of the semiconductor substrate (to be opposed to the film substrate) for electrical connection to the interconnection pattern. The electrode may be, for example, a bump electrode of Au.

The insulative resin portion is composed, for example, of a thermosetting resin. Examples of the thermosetting resin include an epoxy resin, a silicone resin and an acryl resin. In an inventive semiconductor device production method to be described later, the resin is applied onto the film substrate, for example, by a dispenser method, a printing method or the like.

The projection of the interconnection pattern is electrically connected to the electrode of the semiconductor chip, and has a sectional shape tapered toward the electrode of the semiconductor chip for easy intrusion in the electrode of the semiconductor chip. The projection having such a shape may be formed, for example, by adjusting the etching factor and the width of the interconnection pattern as desired in the formation of the pattern.

In the inventive semiconductor device, the projection may have a trapezoidal sectional shape with a distal portion thereof having a width not greater than a half of a maximum width of the electrode. With this arrangement, when the semiconductor chip is pressed against the film substrate in the semiconductor device production process, a portion of the resin present between the projection and the electrode is easily pushed away, so that none of the resin remains between the projection and the electrode. Further, the projection easily intrudes in the electrode, and the projection has a sufficient mechanical strength.

In the inventive semiconductor device, the projection intrudes in the electrode to an average depth of not smaller than 10% of a height of the electrode. With this arrangement, the projection is assuredly bitten by the electrode of the semiconductor chip, so that the strength of the connection between the projection and the electrode is further enhanced. Even if the semiconductor device repeatedly experiences expansion and contraction due to a temperature cycle or is subjected to a high humidity environment during use, the semiconductor chip is less liable to be separated from the film substrate. Thus, the reliability of the connection between the interconnection pattern and the electrode can further be improved.

In the inventive semiconductor device, the projection and the electrode may be heat- and press-bonded to each other. With this arrangement, a diffusion layer or an alloy layer composed of a combination of a material for the projection and a material for the electrode is formed in a connection interface between the projection and the electrode. Thus, the projection and the electrode are more firmly connected to each other. Even if the semiconductor device repeatedly experiences expansion and contraction due to a temperature cycle or is subjected to a high humidity environment during use, the semiconductor chip is less liable to be separated from the film substrate. Thus, the reliability of the connection between the interconnection pattern and the electrode can further be improved.

According to another aspect of the present invention, there is provided a production method for the aforesaid inventive semiconductor device, which comprises the steps of: applying an insulative resin onto a film substrate; mounting a semiconductor chip on the applied resin with an electrode of the semiconductor chip being opposed to a projection of an interconnection pattern provided on the film substrate; and pressing the semiconductor chip against the film substrate at a predetermined pressure and heating the semiconductor chip at a predetermined temperature, whereby the projection pushes away a portion of the resin present between the electrode and the projection and intrudes in the electrode to be connected to the electrode, and the resin is cured.

In the production method, the portion of the resin present between the projection of the interconnection pattern and the electrode is pushed away by a tapered distal portion of the projection, and the projection intrudes in the electrode when the semiconductor chip is pressed against the film substrate. Thus, the electrical connection can effectively be established.

This means that the projection and the electrode are effectively electrically and physically connected to each other with an enhanced mechanical strength, even if the connection is established simply by a contact between the projection and the electrode provided by the pressing and the curing of the resin. Since the portion of the resin present between the projection and the electrode is pushed away by the tapered distal portion of the projection, a positional offset between the projection and the electrode is suppressed which may otherwise occur when the semiconductor chip is pressed against the film substrate. Thus, the reliability of the connection between the projection and the electrode is improved.

Even if a cumulative dimensional difference between projections and electrodes occurs due to expansion of the film substrate attributable to the heating of the semiconductor chip, the reliability of the connection between the projection and the electrode is not deteriorated. This is because the projection intrudes in the electrode thereby to be connected to the electrode with a sufficient contact area.

Even if the interconnection pattern deforms when the semiconductor chip is pressed against the film substrate, the edge touch is prevented because the resin applied on the film substrate intervenes between the film substrate and the peripheral edges of the semiconductor chip.

Where the electrode and the interconnection pattern are composed of gold and copper, respectively, in the inventive production method, a pressure of not lower than about $250 \times 10^{-4}$ gf/$\mu m^2$ may be applied to the semiconductor chip to cause the projection to intrude in the electrode. Where such a relatively high pressure is applied to the semiconductor chip for the connection between the semiconductor chip and the interconnection pattern, the interconnection pattern is liable to deform. However, the edge tough is prevented by the resin intervening between the film substrate and the semiconductor chip.

In the inventive production method, the insulative resin may have a curing temperature of not higher than about 210° C. In this case, it is merely necessary to heat the semiconductor chip at a heating temperature of about 210° C. or higher in the semiconductor chip pressing and heating step. The heating at about 210° C. minimizes the expansion of the film substrate, thereby preventing the cumulative dimensional difference between the projections and the electrodes attributable to the expansion of the film substrate. Where such a relatively low heating temperature on the order of 210° C. is employed for the connection between the semiconductor chip and the interconnection pattern, neither a diffusion layer nor an alloy layer is formed in a connection interface between the projection and the electrode. However, the projection intrudes in the electrode thereby to be connected to the electrode with a sufficient mechanical strength in the inventive production method.

Where the electrode is composed of gold and the projection is composed of a conductor plated with at least one of tin and gold in the inventive production method, at least one of the diffusion layer and the alloy layer may be formed in the connection interface between the electrode and the projection by heating the semiconductor chip at not lower than 300° C. for heat- and press-bonding the electrode to the projection. With this arrangement, at least one of the diffusion layer and the alloy layer composed of a combination of a material for the projection and a material for the electrode is formed in the connection interface between the projection of the interconnection pattern and the electrode, so that the projection is more firmly connected to the electrode. Even if the semiconductor device repeatedly experiences expansion and contraction due to a temperature cycle or is subjected to a high humidity environment during use, the semiconductor chip is less liable to be separated from the film substrate. Thus, the reliability of the connection between the interconnection pattern and the electrode can further be improved.

Where the curing temperature of the insulative resin is not higher than 210° C. and the electrode is composed of gold and the projection is composed of the conductor plated with at least one of tin and gold in the inventive production method, the semiconductor chip may be pressed and heated at a temperature around the curing temperature of the resin for connecting the electrode to the projection and curing the resin, and then at least one of the diffusion layer and the alloy layer may be formed in the connection interface between the electrode and the projection by heating the semiconductor chip at not lower than 300° C. for heat- and press-bonding the electrode to the projection.

In the two-step heating of the semiconductor chip at about 210° C. and about 300° C., the resin is cured at the relatively low temperature on the order of 210° C. to fix the projection and the electrode at a predetermined connection position, and then the semiconductor chip is heated at the relatively high temperature on the order of 300° C. to form at least one of the diffusion layer and the alloy layer composed of the combination of the material for the projection and the material for the electrode in the connection interface between the projection and the electrode. As a result, the projection and the electrode are firmly connected to each other at the predetermined connection position, whereby the reliability of the connection is further improved.

Where the semiconductor chip is heated at the relatively high temperature on the order of 300° C. in the conventional production method, there is a fear that the cumulative dimensional difference between the projections and the electrodes occurs due to the expansion of the film substrate. In the present invention, however, the projection is fixed to the electrode at the predetermined connection position by curing the resin at the relatively low temperature on the order of 210° C. and, at this time, the projection intrudes in the electrode thereby to be connected to the electrode with a sufficient contact area. Hence, there is no cumulative dimensional difference between the projection and the electrode.

In the inventive semiconductor device production method, the semiconductor chip may be heated while being pressed against the film substrate, and then the pressing and the heating of the semiconductor chip may simultaneously be stopped in the semiconductor chip pressing and heating step. Since the pressing and the heating are simultaneously carried out in this production method, the productivity of the semiconductor device is improved.

There are two types of heating tools for pressing the semiconductor chip against the film substrate and heating the semiconductor chip: a pulse heating tool which is capable of heating the semiconductor chip at a given temperature by energization thereof; and a constant heating tool which is capable of constantly heating the semiconductor chip.

Where the pulse heating tool is employed, the semiconductor chip is pressed against the film substrate and, in this state, the tool is energized to heat the semiconductor chip at a given temperature for a predetermined period and then de-energized to cool the semiconductor chip to an ordinary temperature, and the pressing is stopped.

Where the constant heating tool is employed, the semiconductor chip is heated while being pressed against the film substrate, and the pressing and the heating are continued for a predetermined period and then simultaneously stopped.

For improvement of the productivity, the constant heating tool by which the pressing and the heating are simultaneously carried out is more advantageous. In the case of the conventional semiconductor device, there is a possibility that the electrode of the semiconductor chip is separated from the interconnection pattern of the film substrate if the pressing is stopped during the heating. Therefore, it is difficult to employ the constant heating tool.

In the present invention, however, the projection of the interconnection pattern intrudes in the electrode for the connection, so that the mechanical strength of the connection between the projection and the electrode is improved. Therefore, even if the pressing of the semiconductor chip is stopped during the heating of the semiconductor chip, there is no possibility that the electrode of the semiconductor chip is separated from the interconnection pattern of the film substrate. With the use of the constant heating tool which is conventionally unusable, the productivity can be improved in the inventive production method, the insulative resin may contain conductive particles.

Where the insulative resin containing the conductive particles is employed, the projection of the interconnection pattern and the electrode are connected to each other with the conductive particles being present in the connection interface between the projection and the electrode. Therefore, even if a portion of the resin remains in the interface between the projection and the electrode, the projection and the electrode are electrically connected to each other via the conductive particles. Thus, the connection reliability is further improved.

The conductive particles may be fine metal particles. Examples of the fine metal particles include gold-coated resin particles and nickel particles each having a diameter of about 3 μm to about 10 μm.

With reference to the drawings, the present invention will hereinafter be described in detail by way of embodiments thereof. In the following embodiments, like components will be denoted by like reference characters.

First Embodiment

The construction of a COF semiconductor device according to a first embodiment of the present invention will be described with reference to FIGS. 1 and 2. FIG. 1 is a diagram schematically illustrating the construction of the COF semiconductor device according to the first embodiment, and FIG. 2 is a sectional view of the COF semiconductor device taken along a line A—A in FIG. 1.

Figure 2:
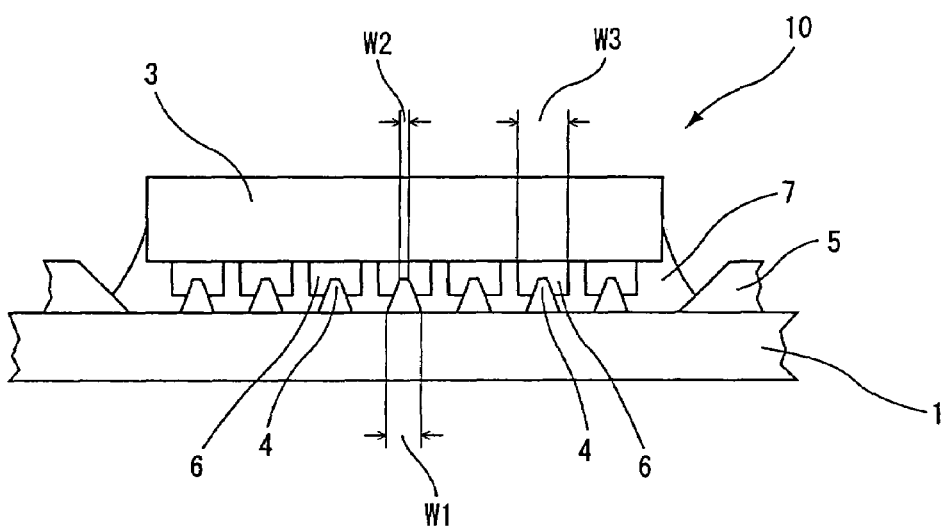
FIG. 2 is a sectional view of the COF semiconductor device taken along a line A—A in FIG. 1.
Figure 3:
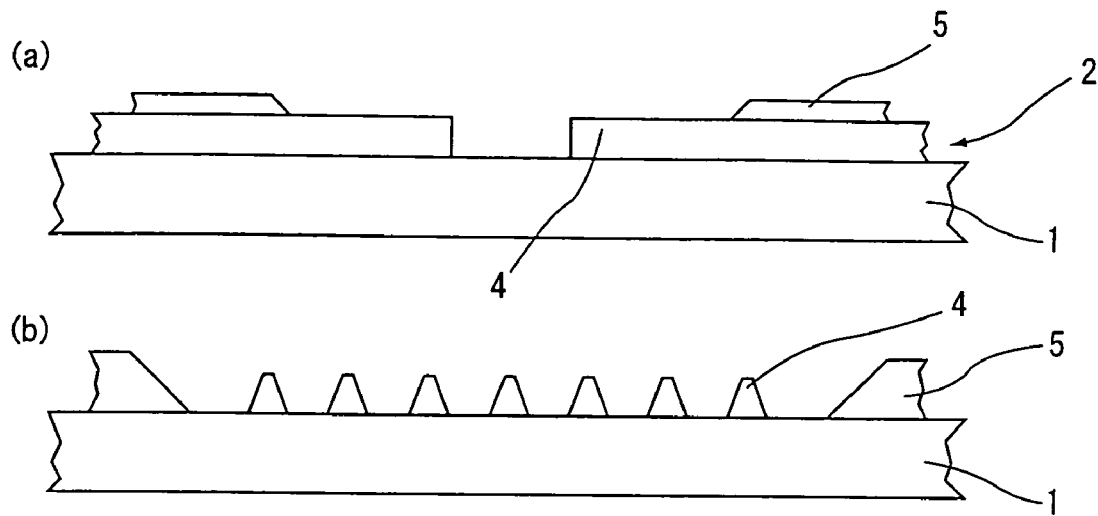
Figure 4:
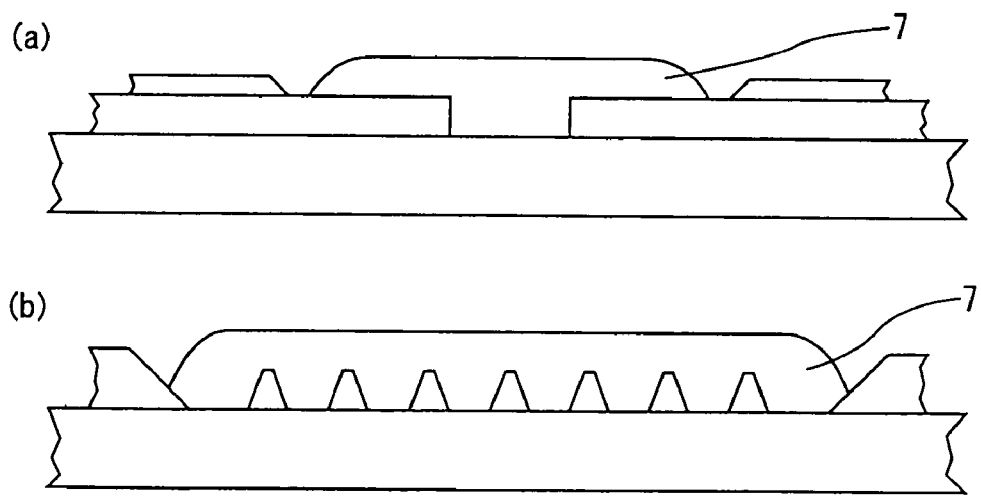
Figure 5:
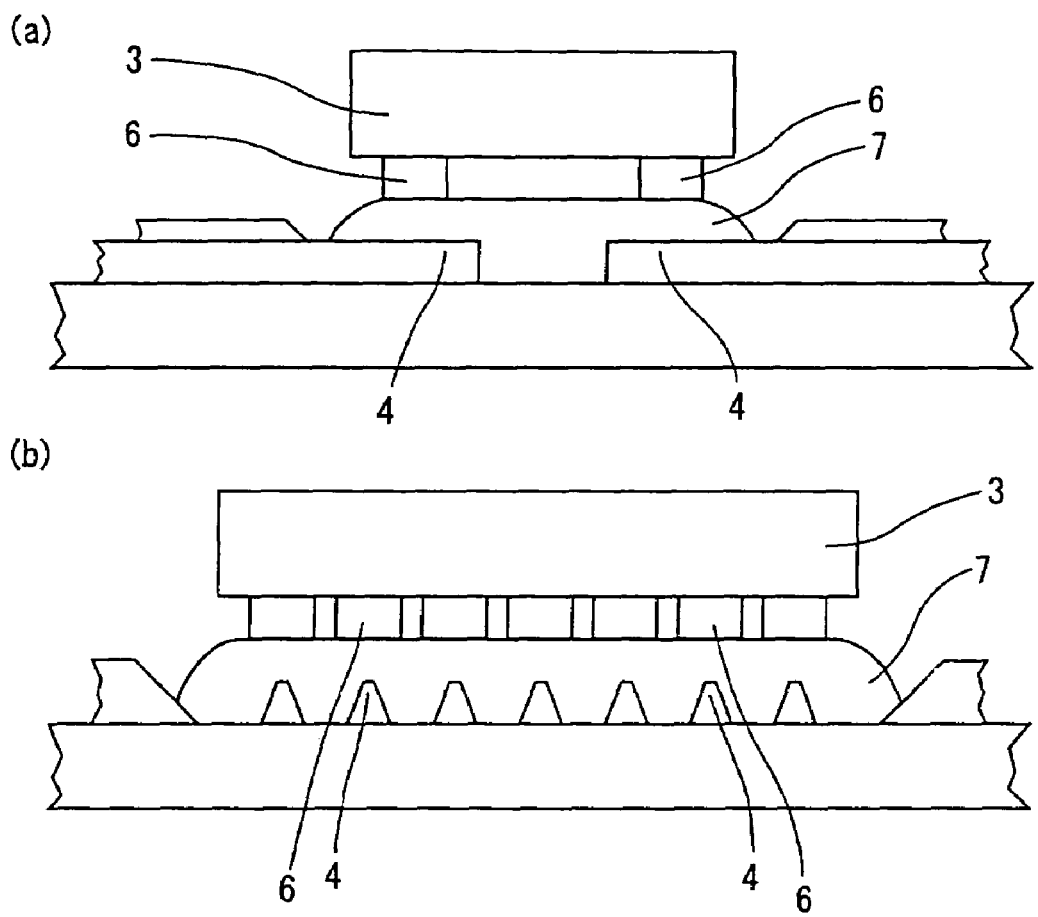
Figure 6:
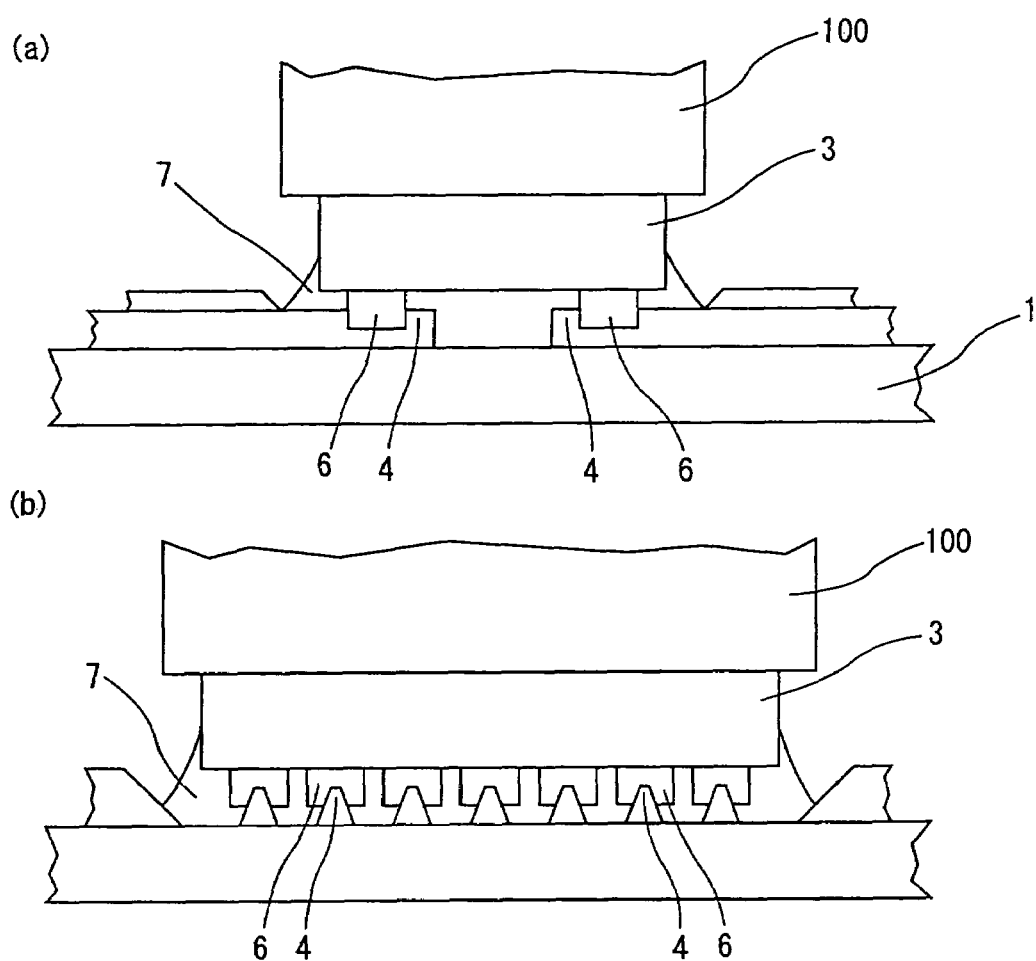
Figure 7:
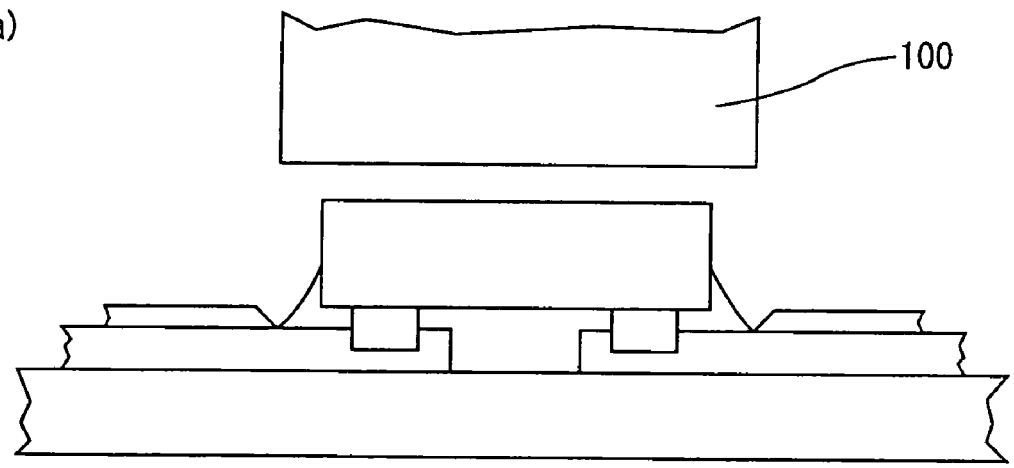
Figure 7:
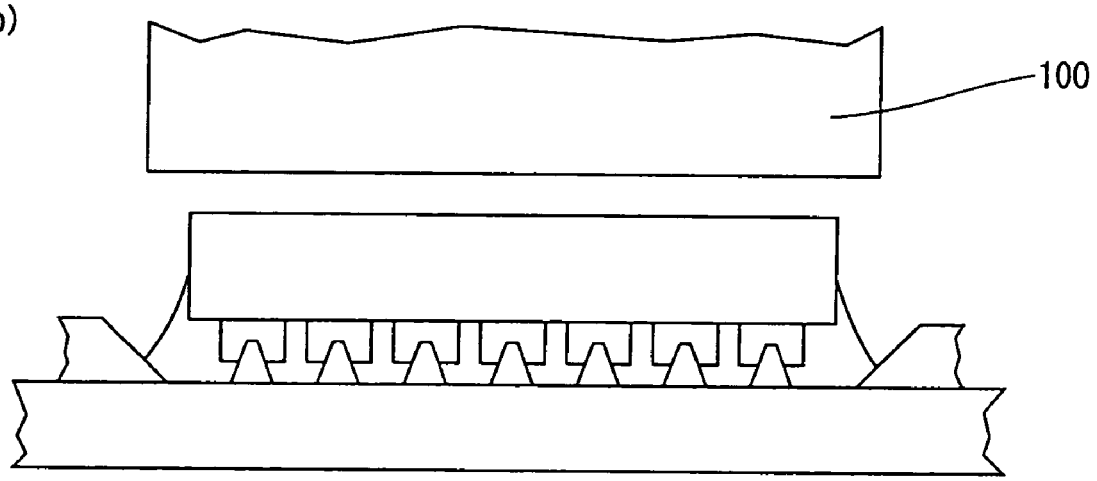

As shown in FIGS. 1 and 2, the COF semiconductor device of the first embodiment includes a film substrate 1 having an interconnection pattern 2 provided on a surface thereof, a semiconductor chip 3 mounted on the film substrate 1 and having bump electrodes 6 provided on a surface thereof, and an insulative resin portion 7 provided between the film substrate 1 and the semiconductor chip 3. The interconnection pattern 2 includes projections 4 which each have a sectional shape tapered toward the electrode 6 of the semiconductor chip 3 and respectively intrude in the electrodes 6 to be electrically connected to the electrodes 6.

The film substrate 1 is a polyimide insulation tape having a thickness of about 15 μm to about 40 μm, and is flexibly bendable.

The interconnection pattern 2 provided on the film substrate 1 comprises a copper foil pattern having a thickness of about 5 μm to about 18 μm and plated with tin or gold (not shown). A portion of the interconnection pattern 2 excluding a semiconductor chip mounting area and connectors for external connection is covered with a solder resist 5 for isolation.

The projections 4 of the interconnection pattern 2 each have a tapered sectional shape (trapezoidal sectional shape) as described above and, for example, have a lower width W1 of about 10±4 μm and an upper width W2 of about 4±3 μm. On the other hand, the bump electrodes 6 are each composed of Au or the like, and have a width W3 of about 15 μm and a height of about 15 μm. The projections 4 respectively intrude in the bump electrodes 6 to an average depth of about 2 μm thereby to be connected to the bump electrodes 6.

Next, a production method for the COF semiconductor device 10 according to the first embodiment will be described with reference to FIGS. 3(a) to 7(a) and FIGS. 3(b) to 7(b), which illustrate the steps of the COF semiconductor device production method according to the first embodiment.

As shown in FIGS. 3(a) and 3(b), a film substrate 1 formed with an interconnection pattern 2 is prepared. The interconnection pattern 2 includes projections 4 provided on a portion thereof on which a semiconductor chip 3 (see FIGS. 5(a) and 5(b)) is mounted. The other portion of the interconnection pattern 2 is covered with a solder resist 5, so that the projections 4 are exposed from the solder resist 5.

In turn, as shown in FIGS. 4(a) and 4(b), an insulative resin 7 (an epoxy resin, a silicone resin, an acryl resin or the like) is applied to a thickness of about 10 μm to about 50 μm on a portion of the film substrate to be mounted with the semiconductor chip 3.

Then, as shown in FIGS. 5(a) and 5(b), the semiconductor chip 3 is positioned and mounted on the applied resin 7 with bump electrodes 6 thereof being respectively opposed to the projections 4 of the interconnection pattern with the intervention of the resin 7.

Subsequently, as shown in FIGS. 6(a) and 6(b), the semiconductor chip 3 is pressed against the film substrate 1 at a pressure of about $250 \times 10^{-4}$ gf/μm$^2$ with the use of a pulse heating tool 100 which is adapted to heat the chip at a given temperature by energization thereof. At this time, portions of the resin 7 present between the projections 4 of the interconnection pattern and the bump electrodes 6 are easily pushed away by the tapered projections 4, so that the projections 4 are respectively brought into contact with the bump electrodes 6 without the intervention of the resin 7. Thereafter, the semiconductor chip 3 is further pressed against the film substrate 1, whereby the tapered projections 4 in contact with the bump electrodes 6 intrude in the bump electrodes 6 to some extent and positioned with respect to the bump electrodes 6.

Then, the pulse heating tool 100 is energized to heat the semiconductor chip 3 at about 230° C. to about 250° C. for about 1 second to about 5 seconds with the semiconductor chip 3 kept pressed against the film substrate 1, whereby the resin is cured. At the same time, the projections 4 of the interconnection pattern are completely bitten in the bump electrodes 6. Thus, the connection between the projections 4 of the interconnection pattern 2 and the bump electrodes 6 is established.

Thereafter, as shown in FIGS. 7(a) and 7(b), the energization of the pulse heating tool 100 is stopped, and the temperature of the pulse heating tool 100 is reduced to an ordinary temperature. Then, the pressing of the semiconductor chip 3 is stopped. Thus, the COF semiconductor device 10 shown in FIGS. 1 and 2 is provided.

Second Embodiment

A semiconductor device production method according to a second embodiment is a modification of the semiconductor device production method according to the first embodiment. In this production method, the semiconductor device 10 (see FIGS. 1 and 2) is produced in substantially the same manner as in the production method according to the first embodiment, except that the semiconductor chip pressing and heating step is modified. Therefore, no explanation will be given to the step of positioning and mounting the semiconductor chip 3 on the resin 7 and the steps precedent thereto (see FIGS. 3(a) to 5(a) and FIGS. 3(b) to 5(b)), and only the step of pressing and heating the semiconductor chip 3 will be described with reference to FIGS. 8(a), 8(b), 9(a) and 9(b).

Figure 8:
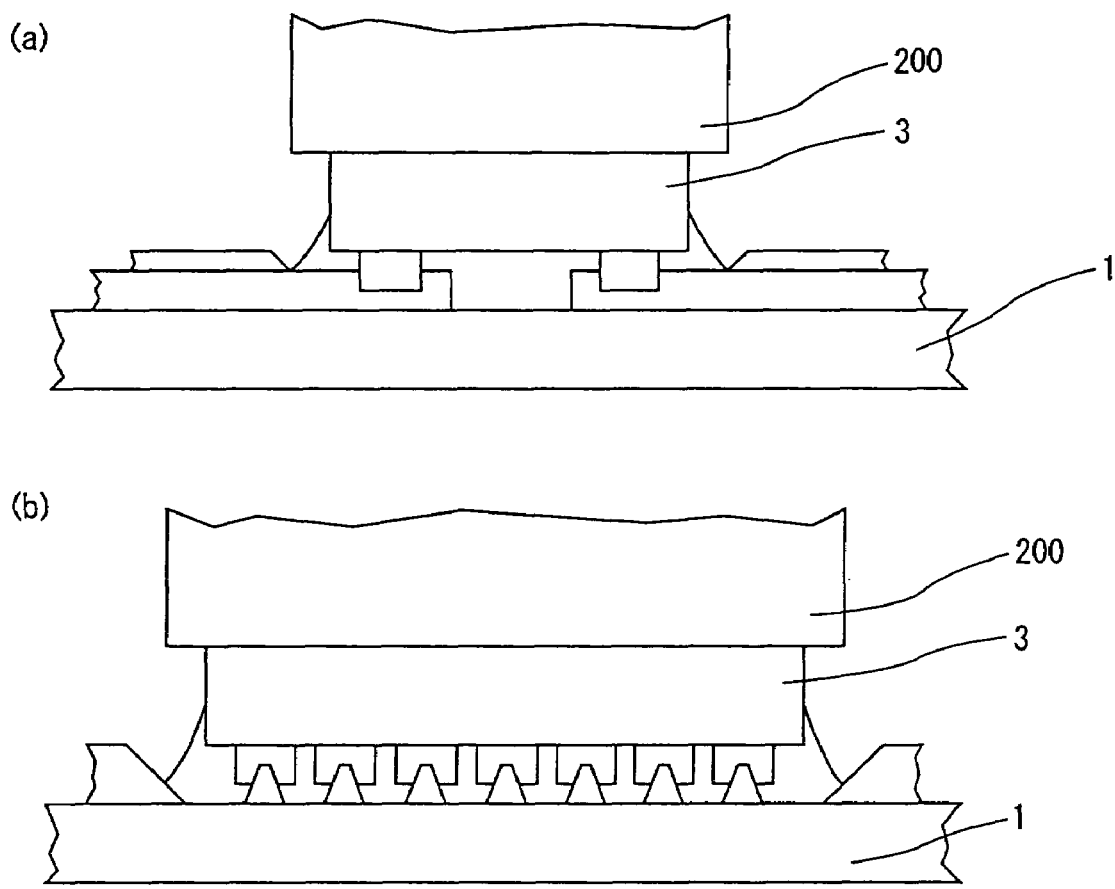
FIGS. 8(a) and 9(a) and FIGS. 8(b) and 9(b) are diagrams for explaining the steps of a COF semiconductor device production process according to a second embodiment of the invention, and respectively illustrate schematic constructions (corresponding to FIG. 1) and sections (corresponding to FIG. 2) provided in the respective steps.

In the second embodiment, as shown in FIGS. 8(a) and 8(b), the semiconductor chip 3 is pressed against the film substrate 1 at a pressure of about $250 \times 10^{-4}$ gf/$\mu$m$^2$ and heated at about 230° C. to about 250° C. for about 1 second to about 5 seconds with the use of a constant heating tool 200 which is constantly kept in a heating state.

Figure 9:
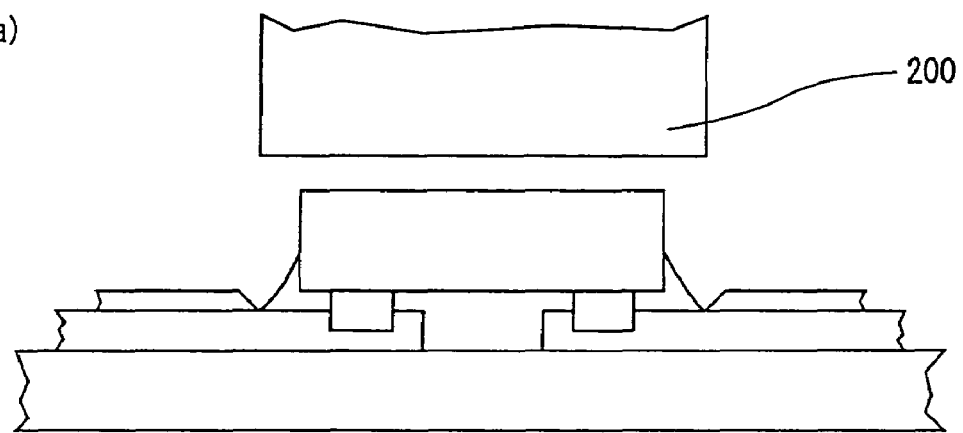
Figure 9:
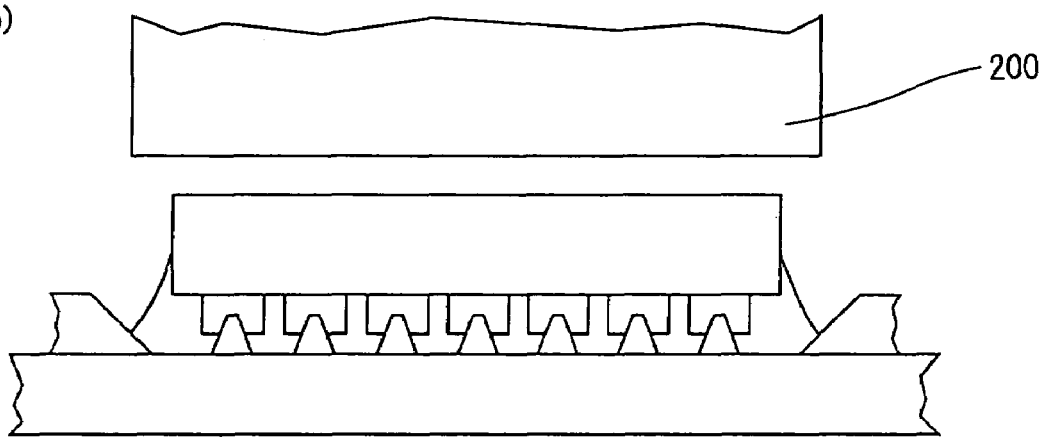

Thereafter, as shown in FIGS. 9(a) and 9(b), the pressing by the constant heating tool 200 is stopped. Thus, the COF semiconductor device 10 shown in FIGS. 1 and 2 is provided. In the second embodiment, the pressing and the heating are simultaneously carried out, and the pressing is stopped without waiting for the cooling of the semiconductor chip 3. Therefore, the productivity is improved over the production method of the first embodiment.

Third Embodiment

Figure 10:
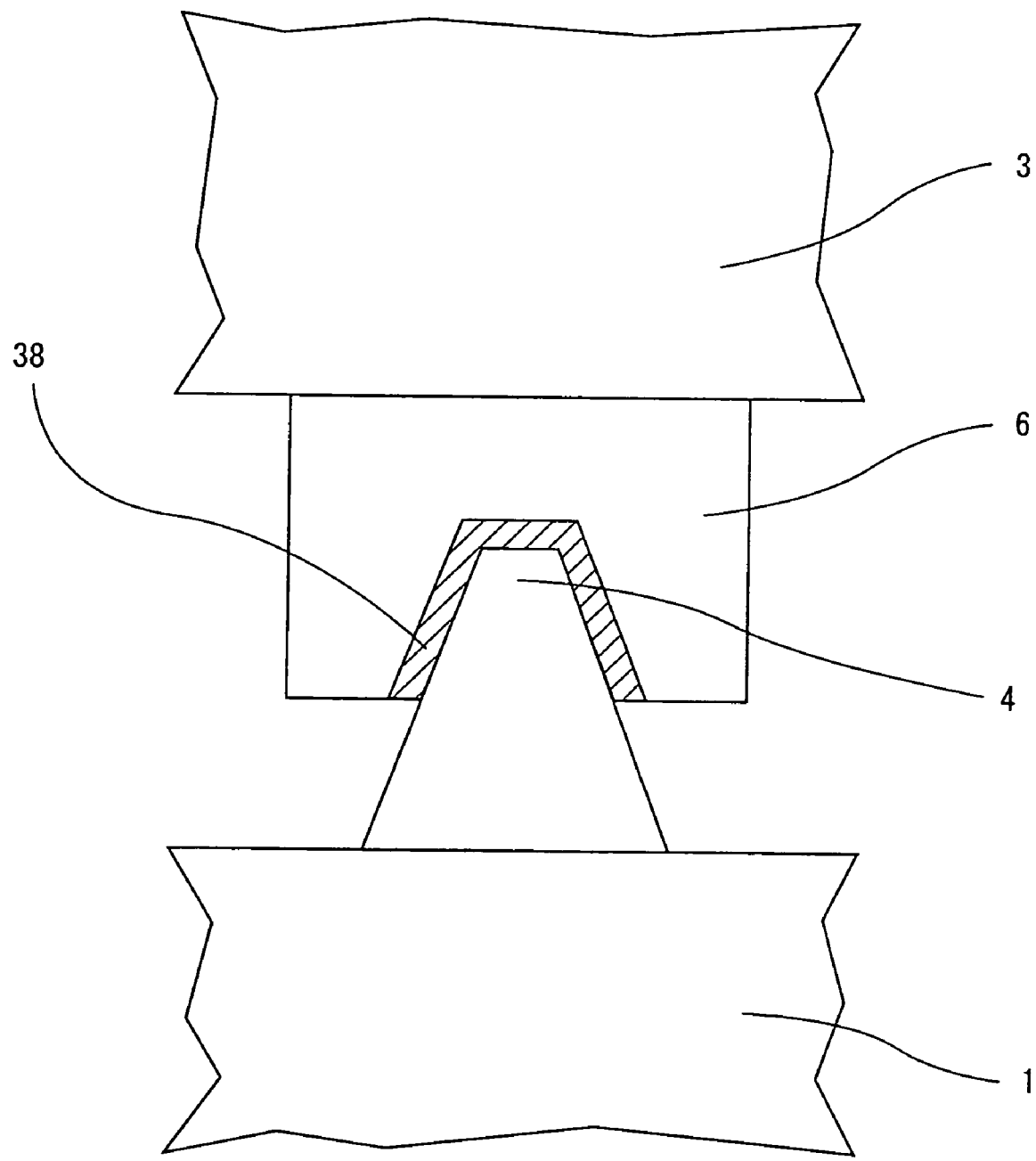
FIG. 10 is an enlarged partial diagram illustrating a COF semiconductor device according to a third embodiment of the invention.
Figure 11:
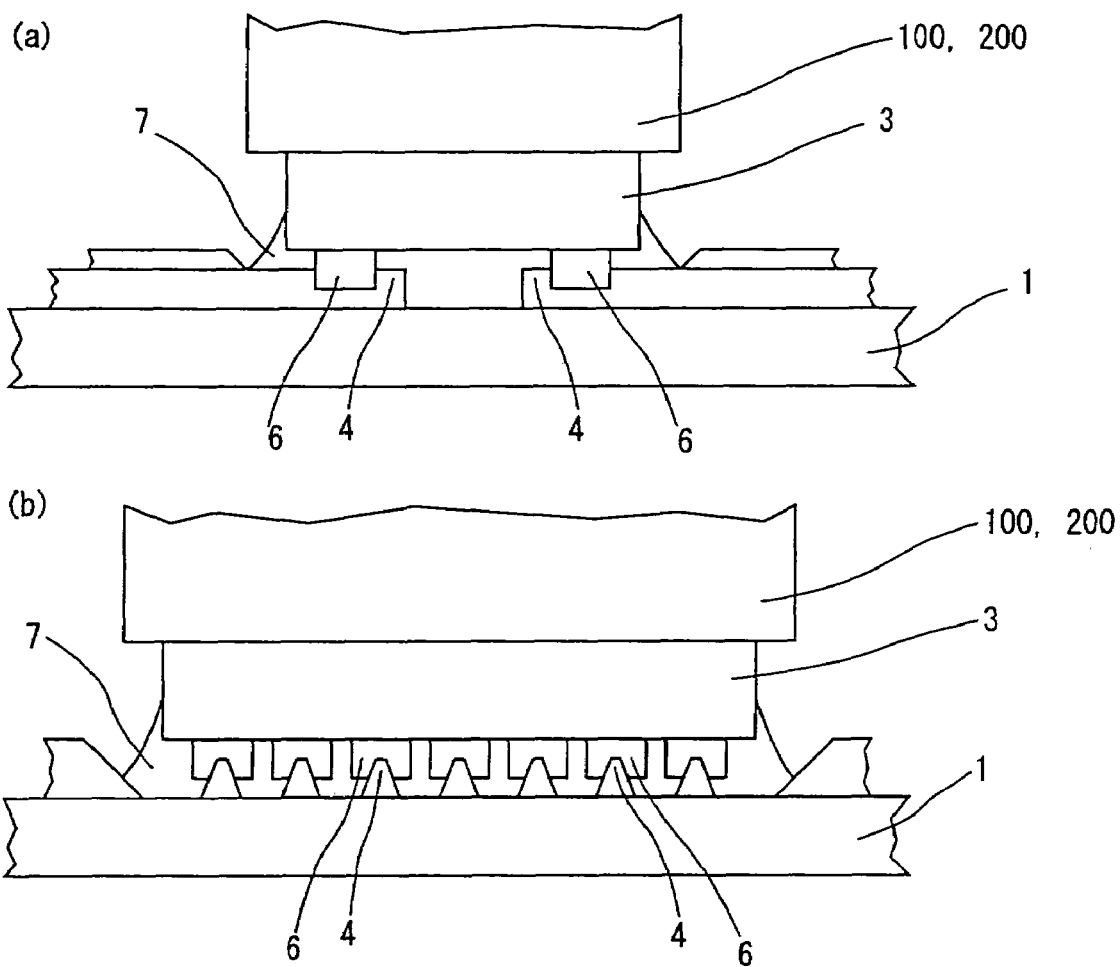
Figure 12:
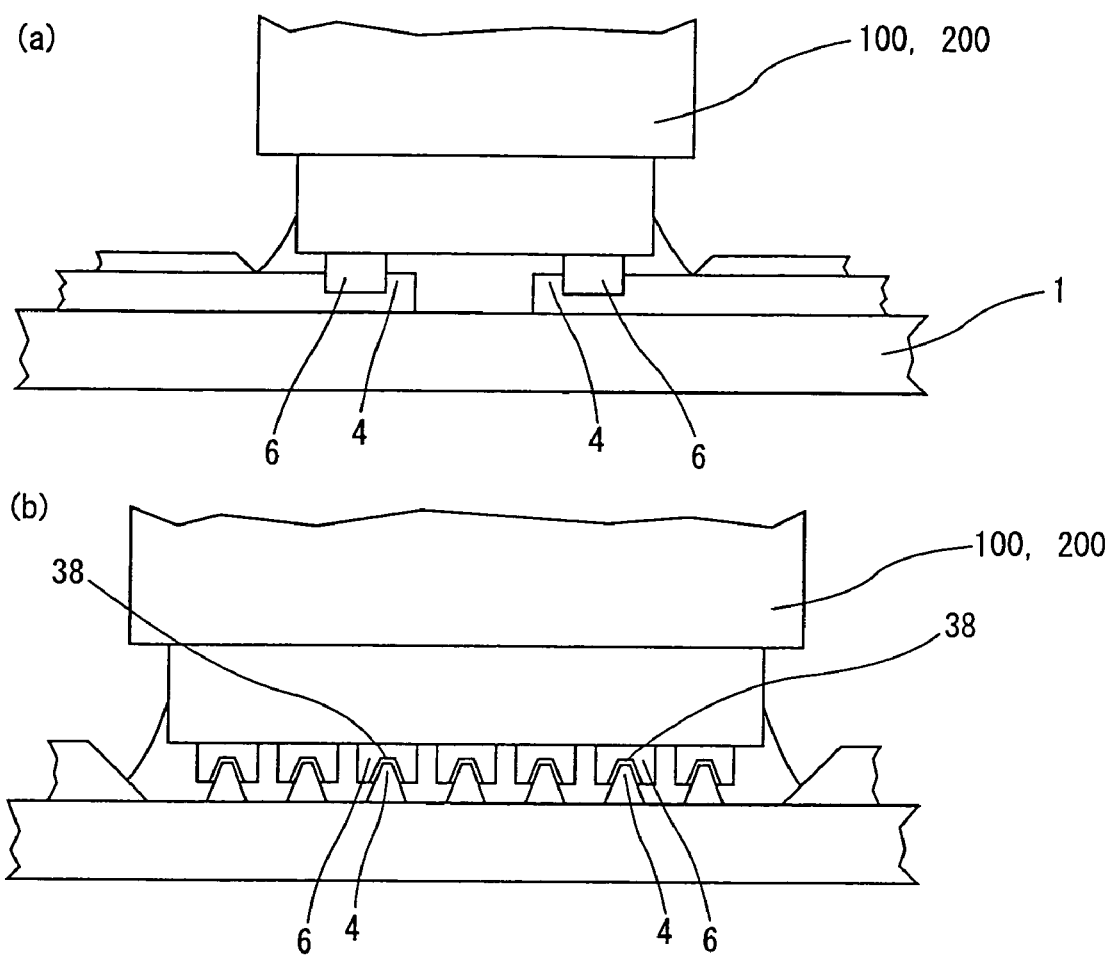
Figure 13:
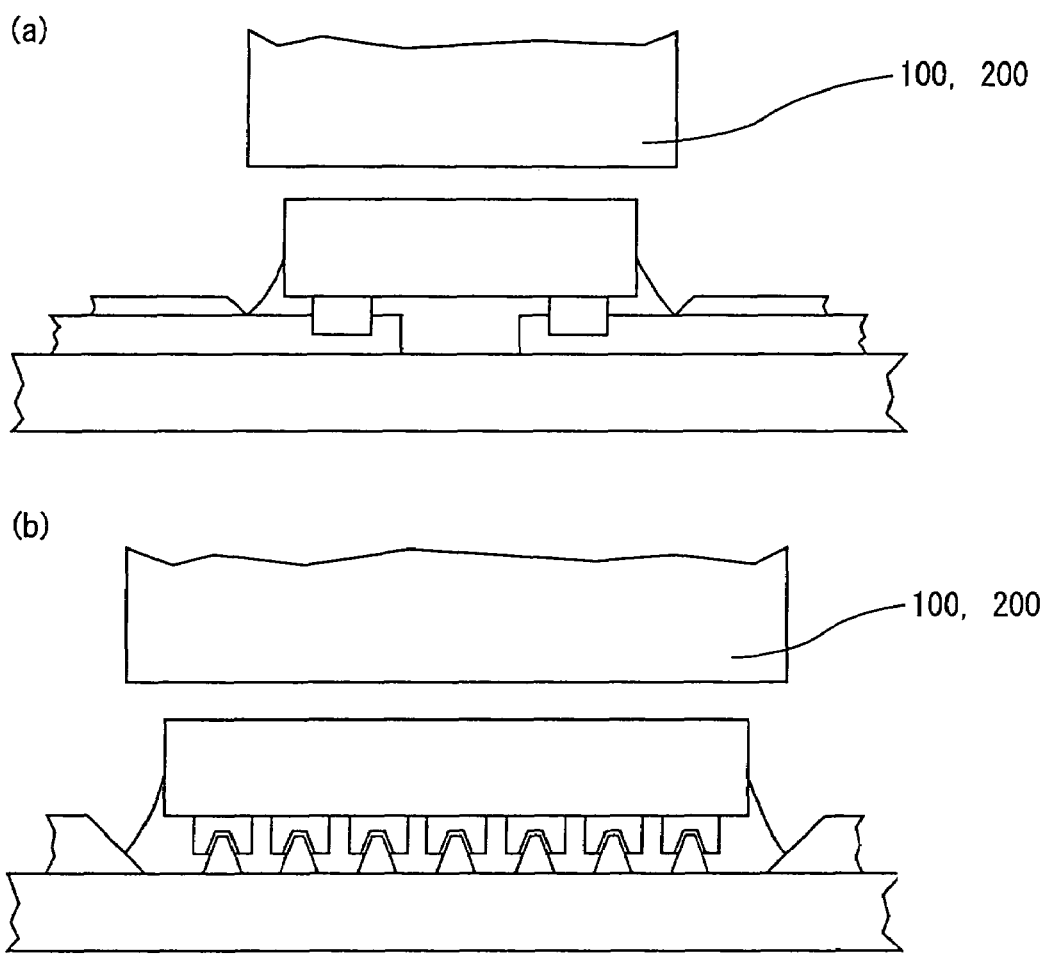

The construction of a COF semiconductor device according to a third embodiment of the present invention will be described with reference to FIG. 10. FIG. 10 is an enlarged partial view of the COF semiconductor device according to the third embodiment.

The COF semiconductor device according to the third embodiment has substantially the same construction as the semiconductor device 10 according to the first or second embodiment (see FIGS. 1 and 2), except that alloy layers 38 of an alloy of metal materials for the projections 4 and the bump electrodes 6 are present in connection interfaces between the projections 4 of the interconnection pattern 2 and the bump electrodes 6 as shown in FIG. 10. Thus, the connection reliability is further improved.

A semiconductor device production method according to the third embodiment is substantially the same as the production method according to the first embodiment, except that the semiconductor chip pressing and heating step is modified.

Therefore, no explanation will be given to the step of positioning and mounting the semiconductor chip 3 on the resin 7 and the steps precedent thereto (see FIGS. 3(a) to 5(a) and FIGS. 3(b) to 5(b)), and only the step of pressing and heating the semiconductor chip 3 will be described with reference to FIGS. 11(a) to 13(a) and 11(b) to 13(b).

In the third embodiment, as shown in FIGS. 11(a) and 11(b), the semiconductor chip 3 is pressed against the film substrate 1 at a pressure of about $250 \times 10^{-4}$ gf/$\mu$m$^2$ and heated at about 210° C. for about 1 second to about 5 seconds with the use of a pulse heating tool 100, whereby the projections 4 of the interconnection pattern 2 are respectively connected to the bump electrodes 6 and the resin 7 is cured.

In turn, as shown in FIGS. 12(a) and 12(b), the heating temperature of the pulse heating tool 100 is increased to about 300° C., for example, whereby diffusion layers or alloy layers 38 are formed in connection interfaces between the projections 4 and the bump electrodes 6.

Thereafter, as shown in FIGS. 13(a) and 13(b), the pressing by the pulse heating tool 100 is stopped. Thus, the COF semiconductor device according to the third embodiment is provided.

Two types of constant heating tools 200 respectively set at 210° C. and 300° C., for example, may be used instead of the pulse heating tool 100 to carry out the two-step heating in the same manner as in the aforesaid case employing the pulse heating tool 100. In this case, the pressing and the heating are simultaneously carried out. Thus, the COF semiconductor device having the aforesaid construction is provided.

Fourth Embodiment

Figure 14:
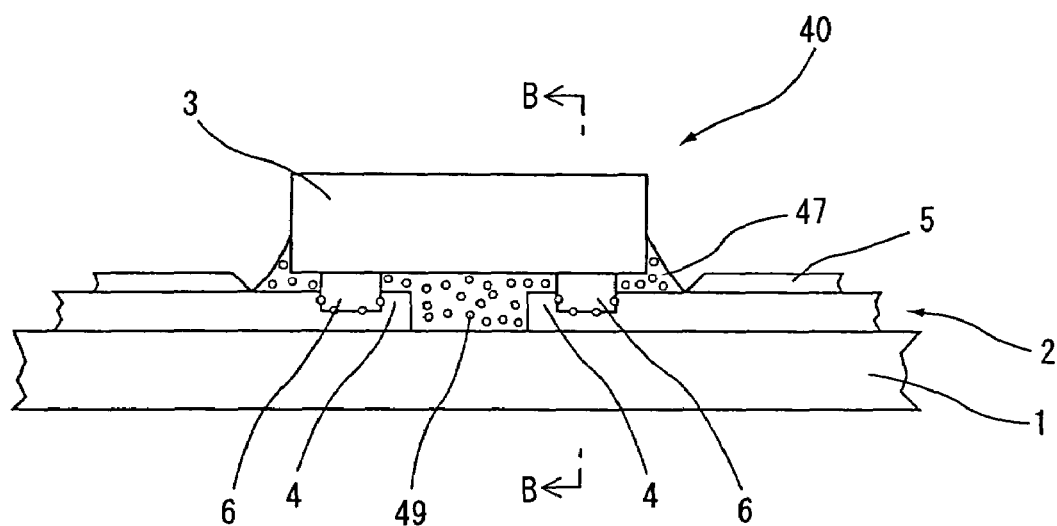
FIG. 14 is a diagram schematically illustrating the construction of a COF semiconductor device according to a fourth embodiment of the invention.

The construction of a COF semiconductor device according to a fourth embodiment of the present invention will be described with reference to FIGS. 14 and 15. FIG. 14 is a diagram schematically illustrating the construction of the COF semiconductor device according to the fourth embodiment, and FIG. 15 is a sectional view of the COF semiconductor device taken along a line B—B in FIG. 14.

Figure 15:
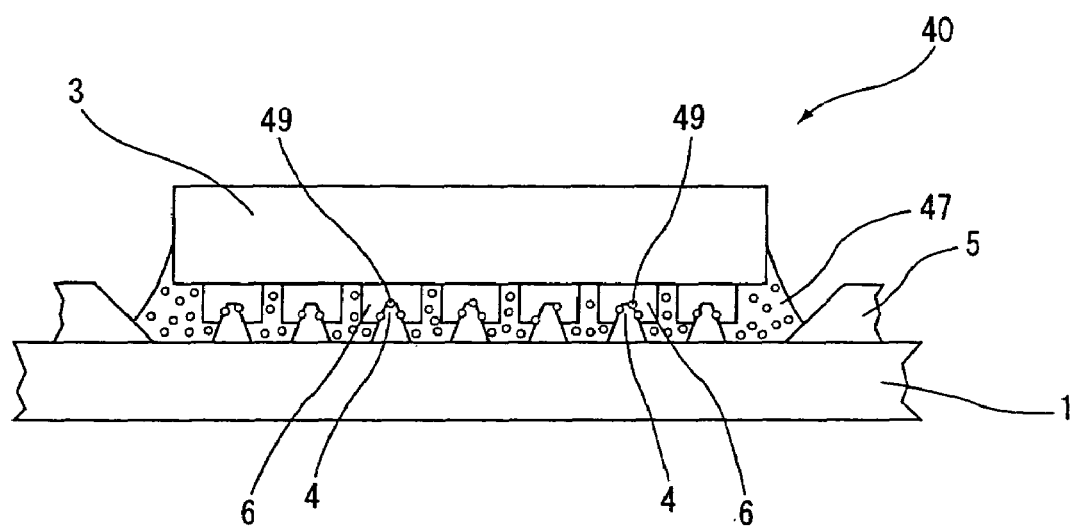
FIG. 15 is a sectional view of the COF semiconductor device taken along a B—B line in FIG. 14.

As shown in FIGS. 14 and 15, the COF semiconductor device 40 according to the fourth embodiment has substantially the same construction as the semiconductor device 10 according to the first or second embodiment (see FIGS. 1 and 2), except that a resin portion 47 provided between the semiconductor chip 3 and the film substrate 1 contains conductive particles 49 dispersed therein. Some of the conductive particles 49 are present in the connection interfaces between the projections 4 of the interconnection pattern 2 and the bump electrodes 6, whereby the connection reliability is further improved.

A production method for the semiconductor device 40 according to the fourth embodiment is substantially the same as the production method according to the first or second embodiment, except that a resin 47 (an epoxy resin, a silicone resin, an acryl resin or the like) containing conductive particles 49 is employed.

According to the present invention, the interconnection pattern includes the projections each having a sectional shape tapered toward the electrode of the semiconductor chip. Therefore, when the semiconductor chip is pressed against the film substrate and heated in the semiconductor device production process, portions of the resin present between the projections and the electrodes are pushed away by the tapered distal portions of the projections, and the projections respectively intrude in the electrodes. Thus, the electrical connection between the projections of the interconnection pattern and the electrodes can effectively be established.

What is claimed is:

1. A semiconductor device comprising:
   a film substrate having an interconnection pattern provided on a surface thereof;
   a semiconductor chip mounted on the film substrate and having an electrode provided on a surface thereof; and
   an insulative resin portion provided between the film substrate and the semiconductor chip, the resin portion having been formed by applying an insulative resin on at least one of the film substrate and the semiconductor chip and filling a space defined between the film substrate and the semiconductor chip with the resin when the semiconductor chip is mounted on the film substrate;

wherein the interconnection pattern has a projection which has a sectional shape tapered toward the electrode of the semiconductor chip and intrudes in the electrode thereby to be electrically connected to the electrode; and wherein the projection intrudes in the electrode to an average depth of not smaller than 10% of a height of the electrode.

2. A semiconductor device comprising:

a film substrate having an interconnection pattern provided on a surface thereof;

a semiconductor chip mounted on the film substrate and having an electrode provided on a surface thereof; and an insulative resin portion provided between the film substrate and the semiconductor chip, the resin portion having been formed by applying an insulative resin on at least one of the film substrate and the semiconductor chip and filling a space defined between the film substrate and the semiconductor chip with the resin when the semiconductor chip is mounted on the film substrate;

wherein the interconnection pattern has a projection which has a sectional shape tapered toward the electrode of the semiconductor chip and intrudes in the electrode thereby to be electrically connected to the electrode; and wherein the projection has a trapezoidal sectional shape with a distal portion thereof having a width not greater than a half of a maximum width of the electrode.

3. A semiconductor device as set forth in claim 2, wherein the projection intrudes in the electrode to an average depth of not smaller than 10% of a height of the electrode.

4. A semiconductor device as set forth in claim 1, wherein the projection and the electrode are heat- and press-bonded to each other.

5. A method of making a semiconductor device, said device comprising:

a film substrate having an interconnection pattern provided on a surface thereof;

a semiconductor chip mounted on the film substrate and having an electrode provided on a surface thereof; and an insulative resin portion provided between the film substrate and the semiconductor chip, the resin portion having been formed by applying an insulative resin on at least one of the film substrate and the semiconductor chip and filling a space defined between the film substrate and the semiconductor chip with the resin when the semiconductor chip is mounted on the film substrate;

wherein the interconnection pattern has a projection which has a sectional shape tapered toward the electrode of the semiconductor chip and intrudes in the electrode thereby to be electrically connected to the electrode;

said method comprising the steps of:

applying an insulative resin onto a film substrate to cover a projection of an interconnection pattern provided on the film substrate with the resin;

mounting a semiconductor chip on the applied resin with an electrode of the semiconductor chip being opposed to the projection; and pressing the semiconductor chip against the film substrate at a predetermined pressure and heating the semiconductor chip at a predetermined temperature, whereby the projection pushes away a portion of the resin present between the electrode and the projection and intrudes in the electrode to be connected to the electrode, and the resin is cured.

6. A semiconductor device production method as set forth in claim 5, wherein the electrode and the interconnection pattern are composed of gold and copper, respectively; and a pressure of not lower than $250 \times 10^{-4}$ gf/μm² is applied to the semiconductor chip to cause the projection to intrude in the electrode in the semiconductor chip pressing and heating step.

7. A semiconductor device production method as set forth in claim 5, wherein the insulative resin has a curing temperature of not higher than 210° C.;

the semiconductor chip is heated at not lower than 210° C. in the semiconductor chip pressing and heating step.

8. A semiconductor device production method as set forth in claim 5, wherein the electrode is composed of gold and the projection is composed of a conductor plated with at least one of tin and gold; and at least one of a diffusion layer and an alloy layer is formed in a connection interface between the electrode and the projection by heating the semiconductor chip at not lower than 300° C. for heat- and press-bonding the electrode to the projection in the semiconductor chip pressing and heating step.

9. A semiconductor device production method as set forth in claim 5, wherein the insulative resin has a curing temperature of not higher than 210° C.;

the electrode is composed of gold and the projection is composed of a conductor plated with at least one of tin and gold; and the semiconductor chip is pressed and heated at a temperature around the curing temperature of the resin for connecting the electrode to the projection and curing the resin, and then at least one of a diffusion layer and an alloy layer is formed in a connection interface between the electrode and the projection by heating the semiconductor chip at not lower than 300° C. for heat- and press-bonding the electrode to the projection in the semiconductor chip pressing and heating step.

10. A semiconductor device production method as set forth in claim 5, wherein the pressing and the heating of the semiconductor chip are simultaneously started and then simultaneously stopped in the semiconductor chip pressing and heating step.

11. A semiconductor device production method as set forth in claim 5, wherein the heating of the semiconductor chip is started after the pressing of the semiconductor chip is started, and the pressing of the semiconductor chip is stopped after the heating of the semiconductor chip is stopped in the semiconductor chip pressing and heating step.

12. A semiconductor device production method as set forth in claim 5, wherein the insulative resin contains conductive particles.

* * * * *